US009958510B2

(12) United States Patent
Sideris et al.

(10) Patent No.: US 9,958,510 B2
(45) Date of Patent: May 1, 2018

(54) INTEGRATED MAGNETIC SPECTROMETER FOR MULTIPLEXED BIOSENSING

(71) Applicant: California Institute of Technology, Pasadena, CA (US)

(72) Inventors: Constantine Sideris, Pasadena, CA (US); Seyed Ali Hajimiri, La Canada, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 294 days.

(21) Appl. No.: 14/028,484

(22) Filed: Sep. 16, 2013

(65) Prior Publication Data

US 2014/0077799 A1    Mar. 20, 2014

Related U.S. Application Data

(60) Provisional application No. 61/700,959, filed on Sep. 14, 2012.

(51) Int. Cl.
  *G01R 33/28*   (2006.01)
  *G01R 33/02*   (2006.01)
  *G01R 33/12*   (2006.01)

(52) U.S. Cl.
  CPC ......... *G01R 33/02* (2013.01); *G01R 33/1269* (2013.01)

(58) Field of Classification Search
  CPC .. G01R 33/543; G01R 33/4818; G01R 33/28; G01R 33/02; G01R 33/5608
  (Continued)

(56) References Cited

U.S. PATENT DOCUMENTS 5,323,063 A  *  6/1994  Chiba .............. H03K 19/01707
                                              327/100
6,028,968 A  *  2/2000  Kurita ................ H04N 1/00681
                                              358/449
(Continued)

FOREIGN PATENT DOCUMENTS

WO   2003/101534 A1   12/2003
WO   2005/073695 A1    8/2005
(Continued)

OTHER PUBLICATIONS

International Search Report and Written Opinion for PCT Application No. PCT/US2013/060011 dated Dec. 23, 2013.
(Continued)

*Primary Examiner* — Jermele M Hollington
*Assistant Examiner* — Taqi Nasir
(74) *Attorney, Agent, or Firm* — Alston & Bird LLP

(57) ABSTRACT

A magnetic spectrometer is integrated in a semiconductor substrate and provides high sensitivity without using an external magnet field. The spectrometer includes one or more highly stable on-chip oscillator and LC resonator. A current caused to pass through the inductor generates a magnetic field and polarizes the nanoparticles placed in its proximity, thereby changing the effective inductance of the inductor, and in turn, modifying the oscillation frequency of the LC resonator. The shift in the oscillation frequency is used to characterize the nanoparticles and measure their magnetic susceptibility frequency profile. The spectrometer operates at multiple frequencies over a diverse range without using a reference sensor thereby effectively increasing its spatial multiplexing density. The magnetic spectrometer uses the relationship between the sizes of the particles and the resonance frequency $F_{res}$ and/or the magnetic frequency
(Continued)

spectrum of the particles as a spectroscopic means of differentiating between the particles.

40 Claims, 4 Drawing Sheets

(58) Field of Classification Search
USPC ....... 324/210, 214, 219, 258, 260, 262, 315, 324/318, 529, 652, 655, 675, 708, 331, 324/345, 381
See application file for complete search history.

(56) References Cited

U.S. PATENT DOCUMENTS

| | | | |
|---|---|---|---|
| 6,323,063 B2 * | 11/2001 | Krames | H01L 33/20 257/E33.07 |
| 2006/0091968 A1 * | 5/2006 | Darabi | H03B 5/1206 331/117 R |
| 2006/0197529 A1 | 9/2006 | Geifman et al. | |
| 2009/0015324 A1 * | 1/2009 | Magoon | H03F 1/02 330/135 |
| 2011/0057682 A1 * | 3/2011 | Bohn | H04B 1/40 324/762.02 |
| 2011/0292950 A1 * | 12/2011 | Nguyen | H03K 19/0175 370/537 |

FOREIGN PATENT DOCUMENTS

| | | | |
|---|---|---|---|
| WO | 2007/128140 A1 | 11/2007 | |
| WO | WO 2007128140 A1 * | 11/2007 | ............ G01R 33/28 |
| WO | 2014/043656 A1 | 3/2014 | |

OTHER PUBLICATIONS

Boero et al., "Fully Integrated probe for Proton Nuclear Magnetic Resonance Magnetometry," Review of Scientific Instruments 72(6): 2764-2768 (2001).
Besse, et al., "Detection of a single magnetic microbead using a miniaturized silicon Hall sensor," Appl. Phys. Letters, 80(22):4199-4201, Jun. 2002.
Fannin, et al., "Investigation of the complex susceptibility of magnetic beads containing maghemite nanoparticles," J. of Mag. and Mag. Mat. 303, pp. 147-152, Dec. 2005.
Fonnum, et al., "Characterisation of Dynabeads by magnetization measurements and Mössbauer spectroscopy," J. of Mag. and Mag. Mat., 293, pp. 41-47, Mar. 2005.
Han, et al., "A High-Density Magnetoresistive Biosensor Array with Drift-Compensation Mechanism," ISCC, 3 pages, Feb. 2007.
Wang, et al., "A Frequency-Shift CMOS Magnetic Biosensor Array with Single-Bead Sensitivity and No External Magnets," ISSCC, pp. 438-440, Feb. 2009, [Retrieved from the Internet Nov. 7, 2017: <http://chic.caltech.edu/wp-content/uploads/2013/05/H-Wang_ISSCC_09.pdf>].
PCT International Preliminary Report on Patentability of application PCT/US2013/060011 dated Mar. 17, 2015.

* cited by examiner

INTEGRATED MAGNETIC SPECTROMETER FOR MULTIPLEXED BIOSENSING

CROSS-REFERENCES TO RELATED APPLICATIONS

The present application claims benefit under 35 USC 119(e) of U.S. provisional application No. 61/700,959, filed Sep. 14, 2012, entitled "Integrated Magnetic Spectrometer For Multiplexed Biosensing", the content of which is incorporated herein by reference in its entirety.

STATEMENT AS TO RIGHTS TO INVENTIONS MADE UNDER FEDERALLY SPONSORED RESEARCH AND DEVELOPMENT

This invention was made with government support under FA8650-09-C-7924 awarded by USAF/ESC. The government has certain rights in the invention.

BACKGROUND OF THE INVENTION

The demand for at-home and point-of-care medical diagnostics tools is on the rise. A number of diagnostic tools exist to quantify and analyze biological cells or molecules in a sample. In accordance with one conventional technique, commonly referred to as magnetic labeling, magnetic nanoparticles (labels) are caused to bind to the target molecules, such as DNAs or protein, undergoing analysis. Integrated biosensors designed to operate based on the magnetic labeling principle dispense with costly optics and thus are less expensive than systems that use fluorescence for bio-molecular detection.

However, despite their relatively higher sensitivity and lower cost, conventional magnetic biosensors measure changes in the magnetic susceptibility either at low frequencies or at a fixed radio frequency (RF), and thus do not differentiate between a large number of small magnetic particles and a smaller number of larger magnetic particles containing a similar magnetic content.

BRIEF SUMMARY OF THE INVENTION

A magnetic spectrometer, in accordance with one embodiment of the present invention includes, in part, at least a first sensor that includes a switched capacitor bank, and a inductor coupled in parallel with the switched capacitor bank and adapted to vary its inductance in response to disposition of a sample placed in its proximity. The inductor and capacitor bank form first LC tank. The magnetic spectrometer also includes a control circuit adapted to receive frequency responses of the first LC tank at a multitude of frequencies defining a frequency range. The frequency responses represent the characteristic of the sample.

In one embodiment, the characteristic id representative of the sizes of the of particles disposed in the sample. In one embodiment, the characteristic representative of a magnetic content of the particles disposed in the sample. In one embodiment, the frequency response at each of the multitude of frequencies includes the frequency response of each of the multitude of the particles disposed in the sample. In one embodiment, the first LC tank is adapted to provide an oscillating signal. In one embodiment, a basing circuit is adapted to bias the at least first sensor and cause the first LC tank to oscillate. In one embodiment, the first sensor further includes a cross-coupled transistor disposed across the first LC tank.

In one embodiment, the switched capacitor bank includes a fixed capacitor coupled across the inductor, and a multitude of switched capacitors each adapted to be coupled across the inductor in response to an associated control signal. In one embodiment, a first buffer is adapted to receive an output of the at least first sensor and provide a buffered analog output signal. The first buffer may be an open-drain buffer.

In one embodiment, the magnetic spectrometer further includes a first buffer adapted to receive an output of the at least first sensor and provide a buffered digital output signal, a divider adapted to divide a frequency of the digital output signal to generate a divided signal, and a counter adapted to count a number of transitions of the divided signal. In one embodiment, the magnetic spectrometer further includes at least a second sensor that includes a switched capacitor bank, an inductor coupled in parallel with the switched capacitor bank and adapted to vary its inductance in response to disposition of a second sample placed in its proximity. The inductor and capacitor bank form a second LC tank. In one embodiment, the magnetic spectrometer further include a basing circuit adapted to bias the at least first and second sensors so as cause the first and second LC tanks to oscillate.

In one embodiment, the magnetic spectrometer further includes, in part, a first buffer adapted to receive an output of the at least first sensor, and a second buffer adapted to receive an output of the at least second sensor and coupled to an output signal of the first buffer. The first and second buffers may be open-drain buffers. The magnetic spectrometer, in accordance with one embodiment further includes, in part, a third buffer adapted to receive an output of the at least first sensor and provide a first buffered digital output signal, a first divider adapted to divide a frequency of the first buffered digital output signal, a fourth buffer adapted to receive an output of the at least second sensor and provide a second buffered digital output signal, a second divider adapted to divide a frequency of the second buffered digital output signal, a multiplexer adapted to selectively output one of the first and second buffered digital output signals, a counter adapted to count a number of transitions of the first buffered digital output signal, and a second counter adapted to count a number of transitions of the second buffered digital output signal.

In one embodiment, the sample is in a liquid form. In another embodiment, the sample is in a dry form. In yet embodiment, the sample includes at least two mixtures of various concentrations of different particles.

A method of detecting a sample, in accordance with one embodiment of the present invention includes, in part, receiving the frequency responses of a first LC tank at a multitude of frequencies defining a frequency range. The first LC tank includes a first inductor adapted to vary its inductance in response to disposition of a sample placed in its proximity, and a first switched capacitor bank coupled across the first inductor. The method further includes, characterizing the sample in accordance with the frequency responses.

In accordance with one method, the characteristic is representative of the sizes of the particles disposed in the sample. In one embodiment, the characteristic is representative of the magnetic content of a the particles disposed in the sample. In one embodiment, the frequency response at each of the multitude of frequencies includes the frequency response of each of the multitude of particles disposed in the sample. In one embodiment, an oscillating signal is provided using the first LC tank. In yet another embodiment, an applied bias caused the first LC tank to oscillate.

In one embodiment, the method further includes disposing a cross-coupled transistor across the first LC tank. In one embodiment, the first switched capacitor bank includes a fixed capacitor coupled across the first inductor, and a multitude of switched capacitors each adapted to be coupled across to the first inductor in response to an associated control signal. In one embodiment, the method further includes, in part, providing a buffered analog output signal in response to first LC tank. In one method, the buffered output is provided using an open-drain buffer.

In one embodiment, the method further includes receiving an output of the first LC tank to provide a buffered digital output signal, dividing a frequency of the digital output signal to generate a divided signal, and counting a number of transitions of the divided signal. In one embodiment, the method further includes receiving frequency responses of a second LC tank at a multitude of frequencies defining a frequency range, and characterizing the second sample in accordance with the frequency responses. The second LC tank includes a second inductor adapted to vary its inductance in response to disposition of a second sample placed in its proximity, and a second switched capacitor bank coupled across the second inductor.

In one embodiment, the method further includes biasing the first and second LC tanks to cause them to oscillate. In one embodiment, the method further buffering an output of a first sensor that includes the first LC tank; and buffering an output of a second that includes the second LC tank. IN one embodiment, the first and second buffers are an pen-drain buffers.

In one embodiment, the method further includes buffering an output of the at least first sensor to provide a first buffered digital output signal, dividing a frequency of the first buffered digital output signal, buffering an output of the at least second sensor to provide a second buffered digital output signal, dividing a frequency of the second buffered digital output signal, selectively outputting one of the first and second buffered digital output signals, counting a number of transitions of the first buffered digital output signal, and counting a number of transitions of the second buffered digital output signal. In one embodiment, the sample is in a liquid form. In one embodiment, the sample is in dry form. In another embodiment, the sample includes at least two mixtures of various concentrations of different particles.

DETAILED DESCRIPTION OF THE INVENTION

In accordance with embodiments of the present invention, a magnetic spectrometer aimed at molecular-level diagnosis is portable, has a relatively high sensitivity and low power consumption and is thus suited for Point-of-Care (PoC) applications. The magnetic spectrometer (hereinafter alternatively referred to as spectrometer or sensor) may be used for in-field medical diagnostics, epidemic disease control, biohazard detection, forensic analysis, and the like.

The spectrometer, in accordance with embodiments of the present invention, is integrated in a semiconductor substrate using, for example, a CMOS process, and provides high sensitivity without using an external magnet field. To achieve this, the integrated spectrometer is adapted to include one or more highly stable on-chip oscillator and LC resonator. A current caused to pass through the inductor generates a magnetic field and polarizes the nanoparticles placed in its proximity, thereby changing the effective inductance of the inductor, and in turn, modifying the oscillation frequency of the LC resonator. The shift in the oscillation frequency is used to characterize the nanoparticles and measure their magnetic susceptibility frequency profile.

In accordance with one embodiment, the spectrometer is adapted to detect, quantify, and characterize magnetic materials in a wide range of frequencies, for example, from 1.1 GHz to 13 GHz. The spectrometer operates at multiple frequencies over a diverse range without using a reference sensor thereby effectively increasing its spatial multiplexing density, consumes less than 2 mW of power, requires no external biasing magnetic field, and may be powered and operated from a USB interface.

In the presence of an external alternating magnetic field, the rate at which magnetic domains reorient themselves to align with the external field is dependent on the domains' size. The larger the domain size, the longer is the alignment time. Therefore, magnetic susceptibility has a frequency-dependent response. As the frequency increases, the dipoles' limited finite reorientation speed results in a decrease of the magnetic susceptibility due to a phase mismatch between the magnetic polarization vector M(t) and the external magnetic field vector H(t). The frequency at which the delay of the magnetic dipole cancels the field effect is referred to as the resonance frequency $F_{res}$—the frequency at which the real part of the magnetic susceptibility becomes nearly zero. As the frequency is increased beyond $F_{res}$, the magnetic susceptibility becomes negative and then asymptotically approaches zero.

Figure 1:
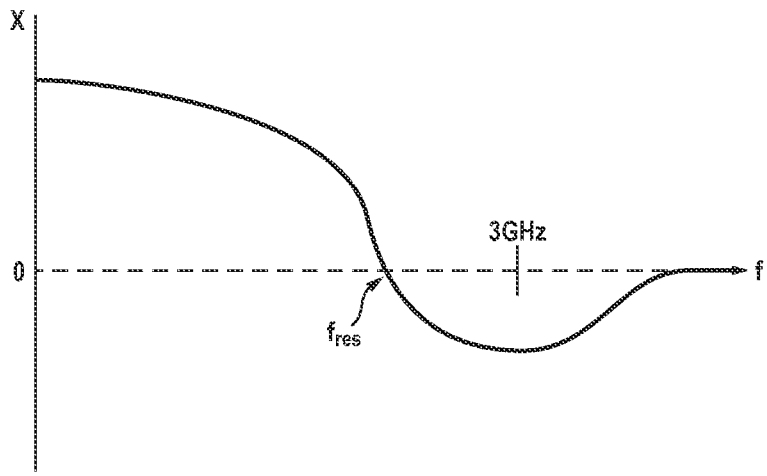
FIG. 1 shows the magnetic susceptibility of a particle as a function of the frequency of an applied magnetic field.

A magnetic spectrometer, in accordance with one embodiment of the present invention, uses the relationship between the sizes of the particles, nanoparticles, molecules, beads, etc. (collectively and alternatively referred to herein as particles or beads) and the resonance frequency $F_{res}$ and/or the magnetic frequency spectrum ("signature") of such particles as a spectroscopic means of differentiating between the particles. FIG. 1 shows the magnetic susceptibility X of a particle as a function of the frequency of an applied magnetic field. As is seen from this graph, as the frequency of the magnetic field increases, the real part of the magnetic susceptibility X decreases. At the resonance frequency $F_{res}$, the magnetic susceptibility X becomes zero. Increasing the frequency beyond $F_{res}$ causes the magnetic susceptibility X to decrease further. Beyond nearly 3 GHz, the slope of the magnetic susceptibility turns positive. The magnetic susceptibility then asymptotically approaches zero, as shown.

A magnetic spectrometer, in accordance with embodiments of the present invention, is adapted to differentiate between different kinds and sized particles through a magnetic multiplexing operation by, in part, scanning the frequency of the magnetic field across a range to establish the frequency spectrum of the particles and identify their zero crossings. In one example, the spectrometer measures the frequency shifts of the samples at 16 different frequency points across a frequency range between 1.1 GHz and 3.3 GHz. Accordingly, in such an example, up to 16 different target particles may be detected during any given frequency scan.

The sensor disposed in the magnetic spectrometer includes a stable free-running oscillator with an on-chip LC resonator. The inductor of the LC tank is the magnetic sensing cell. The inductance of the LC tank changes due to the susceptibility of the magnetic material placed in its proximity. Thus, the full frequency dependent information of susceptibility is detected by measuring resonance frequency shift due to the magnetic materials disposed on or in vicinity of the inductor.

Figure 2:
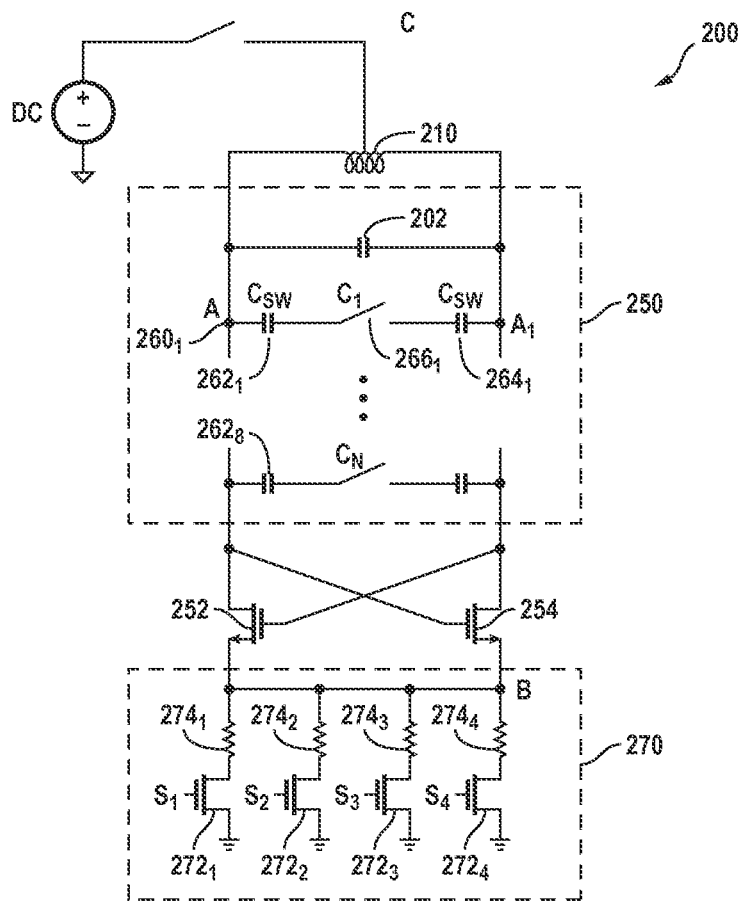
FIG. 2 is a circuit diagram of a magnetic sensor disposed in a magnetic spectrometer, in accordance with one exemplary embodiment of the present invention.

FIG. 2 is a block diagram of a magnetic sensor 200 disposed in a magnetic spectrometer, in accordance with one exemplary embodiment of the present invention. Sensor 200 is arranged as a cross-coupled differential oscillator and is shown as including, in part, a variable inductor 210, a capacitor bank 260, cross-couple transistors 252, 254, and biasing circuit 270. Variable inductor 210 and capacitor bank 250 are coupled across nodes A, A' so as to form an LC tank.

Variable inductor 210 is adapted to vary its inductance in response to the particles disposed in its vicinity, as described further below. Capacitor bank 250 is shown as including a fixed capacitor 202, and 8 switched capacitor stages $260_1$, $260_2$ ... $260_8$. It is understood, however, that in other embodiments, capacitor bank 250 may include any number N of capacitive stages, where N is a positive integer. Each capacitor stage $260_i$, where i is an index ranging from 1 to 8 in this embodiment, is shown as including, in part, a switch $266_i$ and a pair of capacitors $262_i$, $264_i$ having, for example, the same capacitance and disposed on either side of the switch $266_i$. In the specific embodiment shown in FIG. 1, capacitors $262_i$, $264_i$, of capacitor stages $260_1$, $260_2$ ... $260_7$ have the same capacitance $C_{sw}$, and capacitors $262_8$, $264_8$ of capacitor stage $260_8$ have the capacitance $0.5*C_{sw}$. Switches $266_i$ are controlled via signals $C_i$ generated by a control circuit, as described further below.

By turning on/off switches $266_i$, capacitors $262_i$ and $264_i$ are coupled/decoupled from nodes A, A' thus varying the capacitance between these two nodes. For example, when switch $266_1$ is closed, capacitors $262_1$ are $264_1$ coupled to fixed capacitor 202 thereby increasing the total capacitance seen between nodes A, A', and in turn, decreasing the oscillation frequency of the LC tank. In one embodiment, thermometer encoding is used to generate 16 different settings for turning on/off switches $266_i$ thereby to generate 16 different frequencies from, for example, 1.1 GHz to 3.3 GHz. It is understood, however, that any other encoding may be used to turn on/off switches $266_i$. It is also understood that in other embodiments a different frequency range with different number of frequency points may be used. It is further understood that other arrangement of inductors and capacitor may be used to form an LC tank with a variable oscillating frequency.

Cross-coupled transistors 252, 254 are adapted to provide equivalent negative resistances at their drain terminals thereby to attempt to cancel the resistance of the LC tank. Biasing circuit 270 is shown as including a multitude of resistors and transistors that establish the current flow through the LC tank. The gate terminals of transistors 272 disposed in biasing circuit 270, where j is an index ranging from 1 to 4 in this exemplary embodiment, receive control signals $S_j$. When control signals $S_j$ is raised to a high voltage level, transistor $272_j$ is turned on thereby to provide a conductive path between node B (connected to source terminals of transistors 252 and 254) and the ground terminal. The higher the number of transistors $272_j$ that are turned on, the smaller is the effective resistance between node B and the ground terminal, and thus the higher is the current flowing from node B to the ground terminal Sensor 200 may be activate by applying a DC voltage across nodes A, A'. In one embodiment, this DC voltage is supplied via a voltage regular powered by a laptop USB port. The frequency of oscillation of sensor 200 is defined by $$\frac{1}{2\pi\sqrt{LC}},$$

where L and C are respectively the inductance and capacitance across nodes A, A'.

In one example, oscillator 200 achieves a phase-noise of −133.7 dBc/Hz and −66.4 dBc/Hz at 1 MHz and 1 kHz offsets respectively at 1.1 GHz, and −124.8 dBc/Hz and −43.2 dBC/Hz at 1 MHz and 1 kHz offsets respectively at 3.3 GHz. The sensor draws between 3 and 10 mA depending on the adjustable current bias setting from a 0.6V supply and consumes as little as 1.8 mW at the lowest current setting. In one example, the capacitors for switches $262_i$ and $262_i$ have values 1 pF for the 7 identical switches (i ranging from 1 to 7) and 0.5 pF for the 8th switches $262_8$ and $264_8$. The main capacitor 202 for the LC tank is 298 fF. The inductor nominal value for the sensor is 2.5 pH. The resistor values for the current switches $272_4$, $272_4$, $272_4$ and $272_5$ are: 70.6 ohm, 60.6 ohm, 50.7 ohm, 40.8 ohm respectively.

Figure 3:
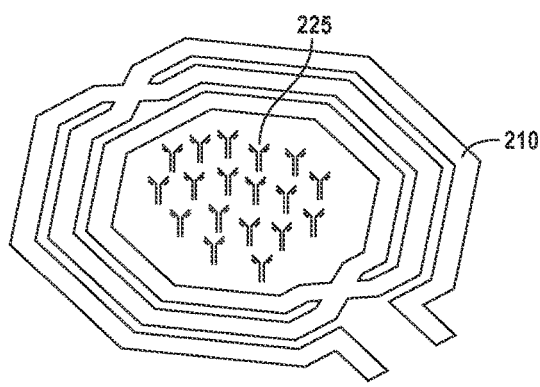
FIG. 3 is a perspective view of the variable inductor of the magnetic sensor of FIG. 2, in accordance with one embodiment of the present invention.

FIG. 3 is a perspective view of variable inductor 210, in accordance with one embodiment of the present invention. In one example, the metal lines of the inductor are 12 um thick and are spaced 10 um apart, and the total inductor area is 260 um×260 um. The inner region 225 of inductor 210 is adapted to hold the samples during magnetic spectroscopy. In one example, this region has an area of 150 um×150 um. Inductor 210 is shaped so as to hold particles disposed on its surface within enclosed region 225. Referring to FIGS. 2 and 3 concurrently, when power is applied to sensor 200, a current flows through inductor 210, in turn causing a magnetic field to be generated across the inductor. This magnetic field causes the particles disposed on region 225 to polarize, thereby modifying the effective inductance of 210 inductor. The change in the inductance, in turn, shifts the resonant frequency of the LC resonator. This shift in the resonant frequency is a measure of the size and/or characteristic of the magnetic nanoparticles located in region 225 and is used to characterize the particles. Inductor 210 is adapted to have a relatively uniform magnetic field across it to achieve the sensitivity required in detecting and/or characterizing the particles placed on its surface.

Figure 4:
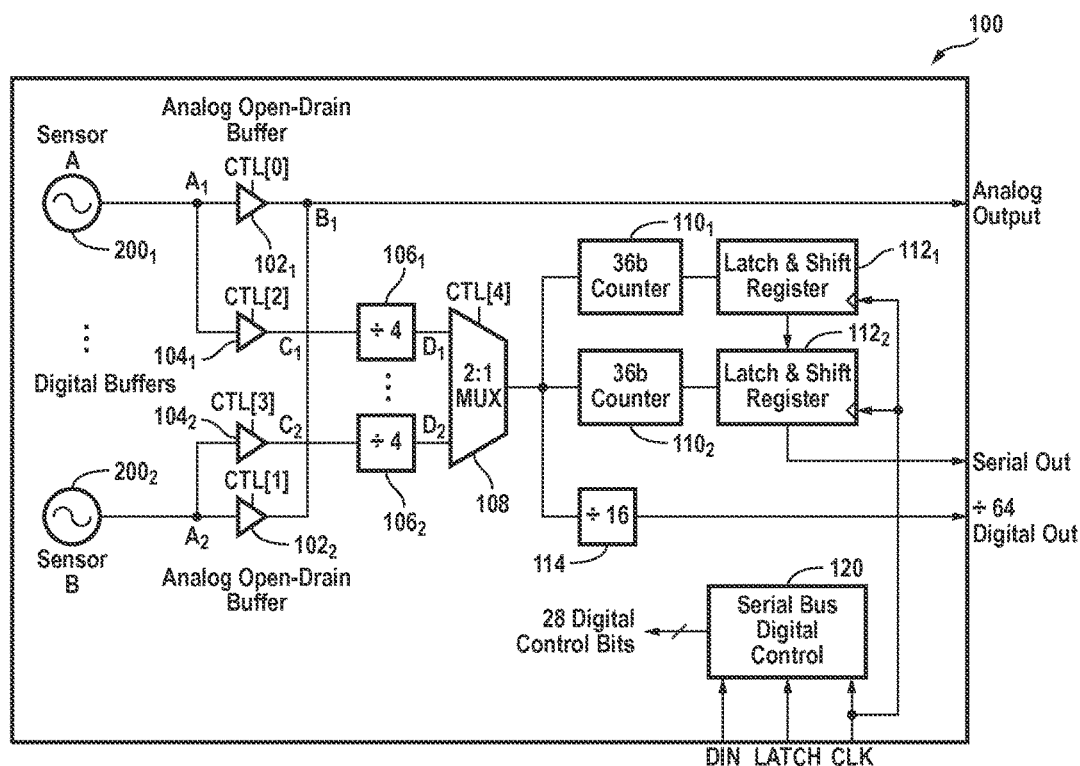
FIG. 4 is a simplified block diagram of a magnetic spectrometer, in accordance with one exemplary embodiment of the present invention.

FIG. 4 is a simplified block diagram of a magnetic spectrometer (also referred to herein as sensing circuit) 100, in accordance with one exemplary embodiment of the present invention. Exemplary sensing circuit 100 includes, in part, two sensors $200_1$, $200_2$ each adapted to concurrently receive signals associated with different sized particles deposited on the sensors as the frequency is scanned across a defined range. Depending on their magnetic characteristics and size of their magnetic domains, the particles attached to different biomolecules can be detected and differentiated. In one embodiment, the magnetic response may be measured at 16 different frequency points across a frequency spectrum ranging from 1.1 GHz to 3.3 GHz. Sensors $200_1$, $200_2$ are similar to sensor 200 shown in FIG. 2 and described above.

The output signal of each of sensors $200_1$, $200_2$ is buffered so as to ensure that the processing of the sensor's output signal does not perturb the operation of the sensor LC tanks. Output signal $A_1$ of sensor $200_1$ is applied to buffers $102_1$ and $104_1$. In one embodiment, buffer $102_1$ is an open drain buffer, which as is known, causes node $B_1$ (i) to be pulled to the supply voltage when the open drain buffer is not active, and (ii) to represent signal of node $A_1$ otherwise. Output signal $A_2$ of sensor $200_2$ is applied to buffers $102_2$ which is also an open drain buffer having an output that is coupled to node $B_1$—an analog output of sensing circuit 100. Buffer $104_1$ buffers and converts signal $A_1$ to a digital signal $C_1$ that may be, for example, a square-wave signal. Divide-by-four block $106_1$ divides signal $C_1$ by 4 to generate and supply signal $D_1$ to multiplexer 108. Likewise, buffer $104_2$ buffers and converts signal $A_2$ to a digital signal $C_2$. Divide-by-four block $106_2$ divides signal $C_2$ by 4 to generate and supply signal $D_2$ to multiplexer 108. Multiplexer 108 is a 2:1 multiplexer adapted to deliver one of its input signals to its output.

When multiplexer 108 supplies signal $D_1$ at its output the terminal, counter $110_1$ counts the number of transitions of signal $D_1$. In one embodiment, counter $110_1$ is a 36-bit counter. Therefore, 36 bits are used to count the number of transitions or frequency of sensor $200_1$. Likewise, when multiplexer 108 supplies signal $D_2$ at its output the terminal, counter $110_2$ counts the number of transitions of signal $D_2$. Counter $110_2$ is a 36-bit counter, therefore 36 bits are used to count the number of transitions or frequency of sensor $200_2$. The outputs of 36-bit counters $110_1$ and $110_2$ are respectively stored in latch and shift registers $112_1$ and $112_2$ which are coupled to one another in series. Accordingly, shift register $112_1$ supplies it data serially to shift register $112_2$ which in turn supplies its data to output terminal Serial_out of sensing circuit 100. Sensing circuit 100 also includes a divided-by-64 output that receives the output of multiplexer 108 and divides this output by 16 using divide-by-sixteen logic block 114.

Control block 120 receives data signal DIN, clock signal CLK and signal LATCH, and in response generates a 28-bit control signal CTL for controlling various operations of sensing circuit 100 as well as sensor $200_1$ and $200_2$, as described further above. Control bits CTL[0], CTL[1], CTL [2], and CTL[3] are used for enabling/disabling buffers $102_1$, $102_2$, $104_1$ and $104_2$, respectively. The capacitor banks and biasing circuits receives 8 bits and 4 bits respectively. Accordingly, for magnetic spectrometer shown in FIG. 4 which has two sensors, 24 bits are used to control the capacitor bank and the biasing circuit.

Figure 5:
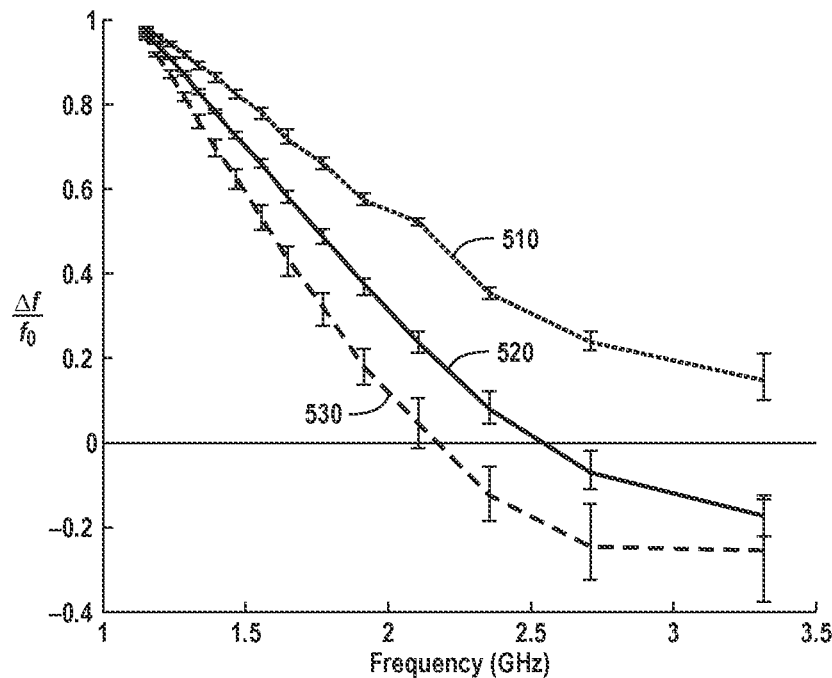
FIG. 5 shows the frequency response of three different kinds of bead as measured by the magnetic spectrometer of FIG. 4.

FIG. 5 shows the frequency response of three different kinds of magnetic beads, as measured by the magnetic spectrometer of FIG. 4. Plots 510 and 520 respectively show the frequency responses of 1 μm and 4.5 μm Dynabeads© beads that are commercially available from Life Technologies Corporation, www.lifetechnologies.com. Plot 530 shows the frequency responses of 1 μm beads, commercially available from Bangs Laboratories, www.bangslabs.com. These magnetic beads are composed of magnetic nanoparticles formed within a polystyrene matrix and coated with a biologically relevant functional group. In FIG. 5, the x-axis represents the frequency, and the y-axis represents $$\frac{f_0}{\Delta f},$$

where $f_0$ indicates the oscillation frequency of sensor 200 with no beads placed in proximity of the inductor, and $\Delta f$ indicates the shift in the oscillation frequency of the sensor from $f_0$ when the beads are placed in proximity of the inductor. To generate these plots, the response at each frequency was normalized to that of the lowest frequency (1.1 GHz) to establish a concentration-independent standardized scale.

In generating the plots shown in FIG. 5, the average of three measurements for each type of bead was taken to reduce the effects of variability that would otherwise result from the increasing phase noise at higher frequencies. The frequency response of each bead is dependent on the size and configuration of nanoparticles inside the polymer matrix forming the beads, and not on the external size of the beads themselves. Therefore, since larger magnetic domains are expected to move slower and thus exhibit resonance at lower frequencies, the magnetic spectrometer, detects 1 μm beads associated with plot 530 as having the largest size internal nanoparticles, while detecting the 1 μm beads associated with plot 510 as having the smallest size nanoparticles internally. This detection is consistent with the bead's known nanoparticle sizes: the beads associated with plot 530 are believed to have a size ranging from 15 nm and 20 nm, whereas the beads associated with plot 510 are believed to have a size ranging from 5 nm to 8 nm nanoparticles.

Figure 6:
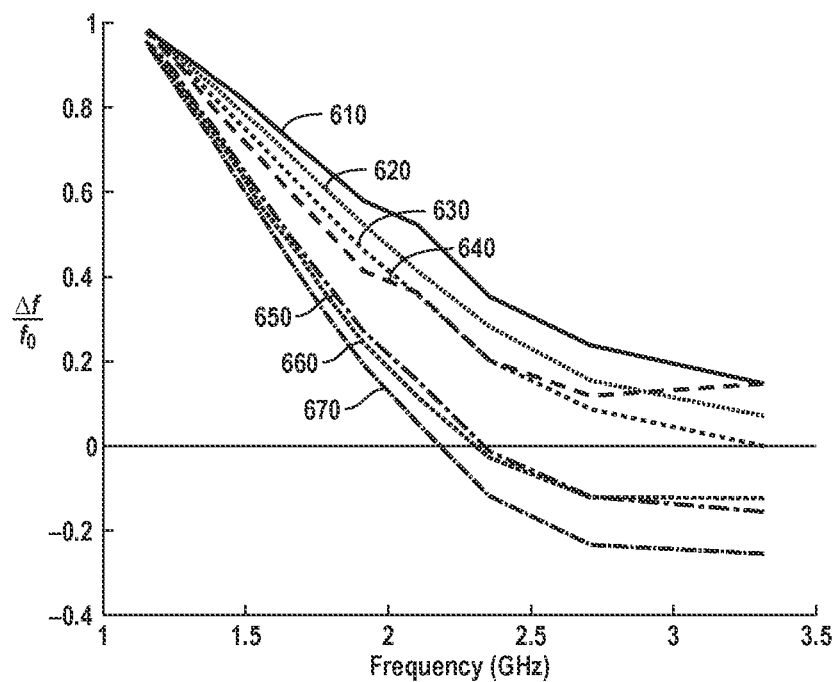
FIG. 6 shows the frequency response of various mixtures of a number of different beads as measured by the magnetic spectrometer of FIG. 4.

As described above, a magnetic spectrometer, in accordance with embodiments of the present invention, is adapted to differentiate between different kinds and sized particles through a magnetic multiplexing operation by, in part, scanning the frequency of the magnetic field across a defined range to establish the frequency spectrum (signature) of the particles and identify their zero crossings. FIG. 6 shows the frequency response of various mixtures of 1 μm Dynabeads© and 1 μm Bangs Laboratories beads, as measured by magnetic spectrometer 100 of FIG. 4. Plot 610 shows the frequency response of a sample that includes nearly 100% 1 μm Dynabeads©; plot 620 shows the frequency response of a sample that includes nearly 87.5% 1 μm Dynabeads© and nearly 12.5% 1 μm Bangs Laboratories beads; plot 630 shows the frequency response of a sample that includes nearly 75% 1 μm Dynabeads© and nearly 25% Bangs Laboratories 1 μm beads; plot 640 shows the frequency response of a sample that includes nearly 50% 1 μm Dynabeads© and nearly 50% Bangs Laboratories 1 μm beads; plot 650 shows the frequency response of a sample that includes nearly 25% 1 μm Dynabeads© and nearly 25% Bangs Laboratories 1 μm beads; plot 660 shows the frequency response of a sample that includes nearly 12.5% 1 μm Dynabeads© and nearly 87.5% Bangs Laboratories 1 μm beads; plot 670 shows the frequency response of a sample that includes nearly 100 Bangs Laboratories 1 μm beads. To reduce the effects of variability, the average of three measurements were taken for each of the points used in the plots.

As was described above with reference to FIGS. 2 and 3, during a frequency sweep (e.g., from 1.1 GHz to 3.3 GHz) a measurement is taken at multiple frequencies (e.g., at 16 different frequencies). Each of the measurements includes the response from all different bead samples. To isolate and determine the proportions of the beads present in each mixture sample, after taking into account the different standard deviations at each frequency, control circuit 120 shown in FIG. 2 performs a σ-weighted least mean square (LMS) algorithm analysis, as described below.

Assume there N different magnetic beads to be detected and differentiated. To achieve this, a liquid solution of each type of bead is standardized to a fixed concentration. For this example N is assumed to smaller than or equal to 16. Next, the frequency shift of each solution is measured separately by the sensor to construct a frequency signature standard. For all 16 frequency points during the frequency sweep, the quantity $$\frac{\Delta f}{f}$$

is then measured.

In accordance with a nonstochastic approach, each such measurement $V_i$, where i is an integer ranging from 1 to N, is a vector having a length of 16. Next a matrix that has N columns each representing a different one of the vectors $V_i$, $V_2 \ldots V_N$ is formed:

$$\underbrace{[V_1 | V_2 | \ldots | V_N]}_{N}$$

Then, by linearity the sensor response due to a mixture of the beads with relative proportions determined by length 16 vector X is defined as:

$$16\underbrace{[Y]}_{1} = 16\underbrace{[A \cdot X]N}_{N \quad 1}$$

In a multiplex sensing, Y is the measured response and, X represents the value that the magnetic spectrometer seeks to determine Using simple linear regression it is seen that:

$$\hat{X} = (A^T A)^{-1} \cdot A^T \cdot Y$$

where $\hat{X}$ represents the reconstruction and is an estimate for the original proportions X.

In accordance with a stochastic approach, a number of measurements are performed for standard solution to obtain estimates of the mean and variance ($\sigma^2$) of each frequency shift for each solution. Accordingly, in a stochastic approach, there are N vectors each having a length of 16 in this example and each represented by mean and standard deviation σi of frequency signatures, where i is an integer ranging from 1 to N.

to give higher weights to measurements with smaller variance, an inverse variance weighted least squares algorithm is used. Assume that diagonal matrix B is defined as follow:

$$16\left\{\underbrace{B}_{16} = \text{diag}\left[\sum_{K=1}^{N} \sigma_K\right]\right.$$

Accordingly, $\tilde{X}$ which represents the inverse-variance weighted least squares estimate of X may be expressed as:

$$\tilde{X} = (A^T A)^{-1} A^T [B^T B]^{-1} Y$$

Figure 7:
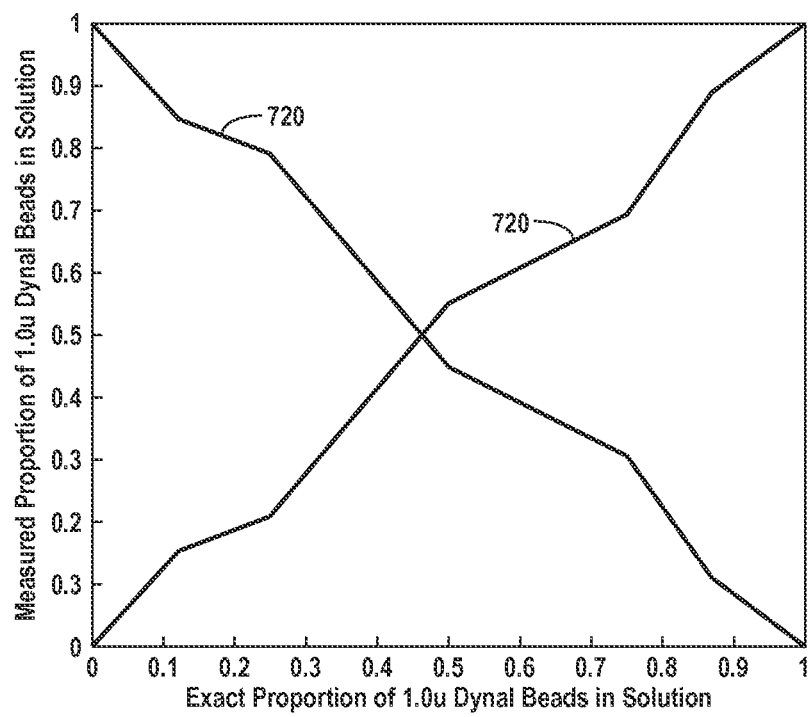
FIG. 7 shows a comparison between known proportions and measured proportions of various beads.

FIG. 7 compares the measured proportions (on the y-axis) of 1 μm Dynabeads© and Bangs Laboratories beads in the samples referenced in connection with FIG. 6—as measured by magnetic spectrometer 100—to the known proportions of these samples on the x-axis. Plots 710 shows the measured versus known proportion of 1 μm Dynabeads©, and plot 720 shows the measured versus known proportions of the Bangs Laboratories beads in the samples. As seen from this Figure, plots 710 and 720 have slopes of 45 and −45 degrees respectively, thus indicating that the measured proportions of the 1 μm Dynabeads© and Bangs Laboratories beads in each sample closely match their known proportions. As is clear from these examples, a magnetic spectrometer, in accordance with the present invention thus advantageously provides magnetic multiplexing over a wide frequency range to achieve enhanced sensitivity.

Figure 8:
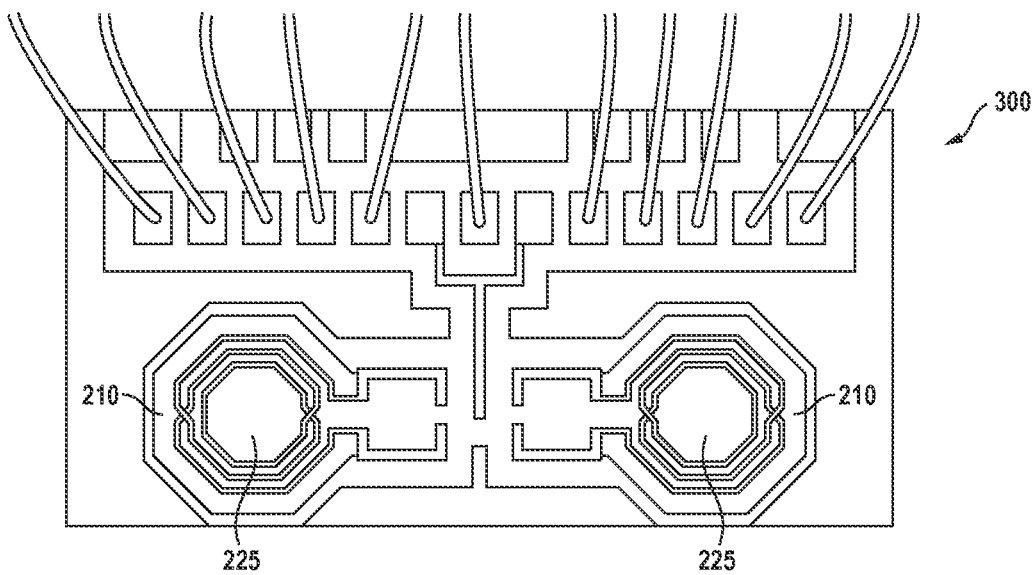
FIG. 8 is a top view of a semiconductor die shown as including a pair of magnetic sensors fabricated using a CMOS process, in accordance with one embodiment of the present invention.

FIG. 8 is a top view of a semiconductor die 300 shown as including a pair of sensors 200 fabricated using a 65 nm CMOS process. Each sensing site is shown as having a surface area of 260 μm×260 μm, sufficient to hold protein or DNA samples for detection using beads, as described above. Semiconductor die 300 is shown as having an area of 1.2 mm×0.6 mm. Semiconductor die 300 also includes the remaining blocks of the spectrometer shown in FIG. 4.

The above embodiments of the present invention are illustrative and not limitative. Embodiments of the present invention are not limited by number of sensors disposed in a spectrometer, nor are they limited by the number of frequency points or the frequency range of the sensor disposed in the spectrometer. The invention is not limited to the design of the inductor, it shape, size and the amount of samples it can hold during a multiplexing operation. The invention is not limited by any design of the oscillator. Embodiments of the present invention are not limited by the type of substrate, semiconductor or otherwise, in which various components of the spectrometer are formed. Other additions, subtractions or modifications are obvious in view of the present disclosure and are intended to fall within the scope of the appended claims.

What is claimed is:

1. A magnetic spectrometer comprising:
   at least a first sensor comprising:
   a switched capacitor bank;
   an inductor coupled in parallel with the switched capacitor bank and adapted to vary its inductance in response to disposition of a sample placed in its proximity, said inductor and capacitor bank forming a first LC tank;
   a control circuit adapted to receive frequency responses of the first LC tank at a plurality of frequencies defining a frequency range, said frequency responses representative of a characteristic of the sample.

2. The magnetic spectrometer of claim 1 wherein said characteristic is representative of sizes of a plurality of particles disposed in the sample.

3. The magnetic spectrometer of claim 1 wherein said characteristic is representative of a magnetic content of a plurality of particles disposed in the sample.

4. The magnetic spectrometer of claim 1 wherein the frequency response at each of the plurality of frequencies includes the frequency response of each of the plurality of particles disposed in the sample.

5. The magnetic spectrometer of claim 1 wherein said first LC tank is adapted to provide an oscillating signal.

6. The magnetic spectrometer of claim 1 further comprising:
a biasing circuit adapted to bias the at least first sensor and cause the first LC tank to oscillate.

7. The magnetic spectrometer of claim 1 wherein the at least first sensor further comprises:
a cross-coupled transistor pair disposed across the first LC tank, said cross-coupled transistor pair comprising:
a first transistor having a gate terminal coupled to a first terminal of the LC tank and a drain terminal coupled to a second terminal of the LC tank; and
a second transistor having a gate terminal coupled to the second terminal of the LC tank and a drain terminal coupled to the first terminal of the LC tank.

8. The magnetic spectrometer of claim 1 wherein said switched capacitor bank comprises a fixed capacitor coupled across the inductor, and a plurality of switched capacitors each adapted to be coupled across the inductor in response to an associated control signal.

9. The magnetic spectrometer of claim 1 further comprising:
a first buffer adapted to receive an output of the at least first sensor and provide a buffered analog output signal.

10. The magnetic spectrometer of claim 9 wherein the first buffer is an open-drain buffer.

11. The magnetic spectrometer of claim 1 further comprising:
a first buffer adapted to receive an output of the at least first sensor and provide a buffered digital output signal;
a divider adapted to divide a frequency of the digital output signal to generate a divided signal; and
a counter adapted to count a number of transitions of the divided signal.

12. The magnetic spectrometer of claim 1 further comprising:
at least a second sensor comprising:
a switched capacitor bank;
an inductor coupled in parallel with the switched capacitor bank and adapted to vary its inductance in response to disposition of a second sample placed in its proximity, said inductor and capacitor bank forming a second LC tank.

13. The magnetic spectrometer of claim 12 further comprising:
a biasing circuit adapted to bias the at least first and second sensors so as cause the first and second LC tanks to oscillate.

14. The magnetic spectrometer of claim 12 further comprising:
a first buffer adapted to receive an output of the at least first sensor
a second buffer adapted to receive an output of the at least second sensor and coupled to an output signal of the first buffer.

15. The magnetic spectrometer of claim 14 wherein the first and second buffer are open-drain buffers.

16. The magnetic spectrometer of claim 15 further comprising:
a third buffer adapted to receive an output of the at least first sensor and provide a first buffered digital output signal;

a first divider adapted to divide a frequency of the first buffered digital output signal;
a fourth buffer adapted to receive an output of the at least second sensor and provide a second buffered digital output signal;
a second divider adapted to divide a frequency of the second buffered digital output signal;
a multiplexer adapted to selectively output one of the first and second buffered digital output signals
a counter adapted to count a number of transitions of the first buffered digital output signal; and
a second counter adapted to count a number of transitions of the second buffered digital output signal.

17. The magnetic spectrometer of claim 1 wherein said sample is in a liquid form.

18. The magnetic spectrometer of claim 1 wherein said sample is in a dry form.

19. The magnetic spectrometer of claim 1 wherein said sample includes at least two mixtures of various concentrations of different particles.

20. A method of detecting a sample, the method comprising:
receiving frequency responses of a first LC tank at a plurality of frequencies defining a frequency range; said first LC tank comprising a first inductor adapted to vary its inductance in response to disposition of a sample placed in its proximity, and a first switched capacitor bank coupled across the first inductor; and
characterizing the sample in accordance with the frequency responses.

21. The method of claim 20 wherein said characteristic is representative of sizes of a plurality of particles disposed in the sample.

22. The method of claim 20 wherein said characteristic is representative of a magnetic content of a plurality of particles disposed in the sample.

23. The method of claim 20 wherein the frequency response at each of the plurality of frequencies includes the frequency response of each of the plurality of particles disposed in the sample.

24. The method of claim 20 further comprising:
provide an oscillating signal using the first LC tank.

25. The method of claim 24 further comprising:
causing the first LC tank to oscillate in response to an applied bias.

26. The method of claim 20 further comprising:
disposing a cross-coupled transistor pair across the first LC tank, said cross-coupled transistor pair comprising:
a first transistor having a gate terminal coupled to a first terminal of the LC tank and a drain terminal coupled to a second terminal of the LC tank; and
a second transistor having a gate terminal coupled to the second terminal of the LC tank and a drain terminal coupled to the first terminal of the LC tank.

27. The method of claim 20 wherein said first switched capacitor bank comprises a fixed capacitor coupled across the first inductor, and a plurality of switched capacitors each adapted to be coupled across to the first inductor in response to an associated control signal.

28. The method of claim 20 wherein further comprising:
providing a buffered analog output signal in response to first LC tank.

29. The method of claim 28 wherein said buffered output is provided using an open-drain buffer.

30. The method of claim 20 further comprising:
receiving an output of the first LC tank to provide a buffered digital output signal;

dividing a frequency of the digital output signal to generate a divided signal; and counting a number of transitions of the divided signal.

31. The method of claim 20 further comprising:

receiving frequency responses of a second LC tank at a plurality of frequencies defining a frequency range; said second LC tank comprising a second inductor adapted to vary its inductance in response to disposition of a second sample placed in its proximity, and a second switched capacitor bank coupled across the second inductor; and characterizing the second sample in accordance with the frequency responses.

32. The method of claim 31 further comprising:

biasing the first and second LC tanks to cause them to oscillate.

33. The method of claim 31 further comprising:

buffering an output of a first sensor comprising the first LC tank; and buffering an output of a second comprising the second LC tank.

34. The method of claim 33 wherein the first and second buffers are an open drain buffers.

35. The method of claim 34 further comprising:

buffering an output of the at least first sensor to provide a first buffered digital output signal;

dividing a frequency of the first buffered digital output signal;

buffering an output of the at least second sensor to provide a second buffered digital output signal;

dividing a frequency of the second buffered digital output signal;

selectively outputting one of the first and second buffered digital output signals;

counting a number of transitions of the first buffered digital output signal; and counting a number of transitions of the second buffered digital output signal.

36. The method of claim 20 wherein said sample is in a liquid form.

37. The method of claim 20 wherein said sample is in a dry form.

38. The method of claim 20 wherein said sample includes at least two mixtures of various concentrations of different particles.

39. The magnetic spectrometer of claim 7 further comprising a biasing circuit coupled to the source terminals of first and second transistors.

40. The magnetic spectrometer of claim 26 further comprising coupling a biasing circuit to the source terminals of the first and second-transistors.

* * * * *